US009903893B2

(12) United States Patent
Da Silva et al.

(10) Patent No.: US 9,903,893 B2
(45) Date of Patent: Feb. 27, 2018

(54) METHOD AND DEVICE FOR REGISTERING ELECTRICAL CONSUMPTION AND GENERATION

(75) Inventors: Pedro Da Silva, Kirchheim (DE); Wolfgang Friede, Weinstadt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1406 days.

(21) Appl. No.: 13/635,323

(22) PCT Filed: Jan. 18, 2011

(86) PCT No.: PCT/EP2011/050588
§ 371 (c)(1),
(2), (4) Date: Dec. 17, 2012

(87) PCT Pub. No.: WO2011/113623
PCT Pub. Date: Sep. 22, 2011

(65) Prior Publication Data
US 2013/0085693 A1  Apr. 4, 2013

(30) Foreign Application Priority Data

Mar. 16, 2010  (DE) ........................ 10 2010 002 914

(51) Int. Cl.
*G05D 3/12* (2006.01)
*G05D 5/00* (2006.01)
(Continued)

(52) U.S. Cl.
CPC .............. *G01R 21/00* (2013.01); *H02J 3/008* (2013.01); *H02J 13/0006* (2013.01); *Y04S 50/10* (2013.01)

(58) Field of Classification Search
None
See application file for complete search history.

(56) References Cited

U.S. PATENT DOCUMENTS

| 6,583,521 B1* | 6/2003 | Lagod | H02J 3/005 307/29 |
| 2003/0036820 A1* | 2/2003 | Yellepeddy | G05B 15/02 700/291 |

(Continued)

FOREIGN PATENT DOCUMENTS

| CN | 1573776 | 2/2005 |
| CN | 101436778 | 5/2009 |

(Continued)

OTHER PUBLICATIONS

International Search Report, PCT International Application No. PCT/EP2011/050588, dated Aug. 18, 2011.

*Primary Examiner* — Mohammad Ali
*Assistant Examiner* — Md Azad
(74) *Attorney, Agent, or Firm* — Norton Rose Fulbright US LLP; Gerard Messina (57) ABSTRACT

A method and device for registering electrical consumption and generation in an energy management network has at least one energy management unit, and, in a power distribution system, a number of electrical consumers or consumer groups and a number of generators are interconnected with the aid of assigned components in the form of switching elements and energy meters, which are influenced or analyzed by the energy management unit, as a function of the purchase price and the feed-in remuneration.

17 Claims, 6 Drawing Sheets

(51) Int. Cl.
G05D 9/00 (2006.01)
G05D 11/00 (2006.01)
G05D 17/00 (2006.01)
G01R 21/00 (2006.01)
H02J 3/00 (2006.01)
H02J 13/00 (2006.01)

(56) References Cited

U.S. PATENT DOCUMENTS

| | | | |
|---|---|---|---|
| 2007/0271006 A1 | 11/2007 | Golden et al. | |
| 2011/0172841 A1* | 7/2011 | Forbes, Jr. | G01D 4/004 700/292 |
| 2015/0094968 A1* | 4/2015 | Jia | G06Q 40/04 702/60 |
| 2015/0207319 A1* | 7/2015 | Miller | G06Q 50/06 700/291 |

FOREIGN PATENT DOCUMENTS

| | | |
|---|---|---|
| DE | 20218473 | 4/2003 |
| DE | 10 2004 055 088 | 5/2006 |
| EP | 1 339 153 | 8/2003 |
| EP | 1 777 793 | 4/2007 |
| WO | WO 2007/041693 | 4/2007 |
| WO | WO 2008/148418 | 12/2008 |

* cited by examiner

| Application | Switching Element | | | | | | | |
|---|---|---|---|---|---|---|---|---|
| | Module 1 | | | Module 2 | | | | |
| | 1A | 1B | 1C | 2A | 2B | 2C | 3 | |
| 1 | closed | open | open | closed | open | open | closed | |
| 2 | closed | open | open | open | closed | closed | open | |
| 3 | closed | open | open | open | closed | closed | open | |
| 4 | open | closed | closed | open | open | closed | open | |

METHOD AND DEVICE FOR REGISTERING ELECTRICAL CONSUMPTION AND GENERATION

CROSS REFERENCES TO RELATED APPLICATIONS

The present application is the national stage entry of International Patent Application No. PCT/EP2011/050588, filed on Jan. 18, 2011, and claims priority to Application No. DE 10 2010 002 914.9, filed in the Federal Republic of Germany on Mar. 16, 2010.

FIELD OF INVENTION

The present invention relates to a method for registering electrical consumption and generation in an energy management network, which has at least one energy management unit, and a number of electrical consumers or consumer groups and a number of generators being interconnected in a power distribution system with the aid of assigned components in the form of switching elements and energy meters, which are influenced or analyzed by the energy management unit.

Furthermore, the present invention relates to an energy management system in the form of at least one energy management unit for optimizing loads and generation in an energy management network, the device, for connection in a power distribution system of at least one electrical consumer or a consumer group and at least one generator, having components assigned thereto in the form of switching elements and energy meters, which may be influenced or analyzed by the energy management unit via a connection thereto.

BACKGROUND INFORMATION

Presently, in most cases, the electrical consumption of households is measured using mechanical alternating current meters or three-phase current meters according to the induction principle. These meters ascertain the power (=energy) integrated over time. In special forms, they may separately meter day/night consumption or feed-in/consumption using multiple counter mechanisms. In parallel, electronic meters already exist, which ascertain the transmitted power and therefore the energy via the integration of the product of current and voltage value.

Energy management systems having corresponding software for energy consumption optimization have become known in the meantime for residential and commercial buildings. However, all approaches on the market may only be put into operation with substantial installation outlay. In addition, such systems may only be used in a restricted way.

Such approaches are based, for example, on energy management software, which is connected to an installed building control system (BCS). The existing software solutions have limited capability, using the provided sensors, of detecting the energetic actual states of the building technology which is connected to this BCS. Automatic control on the basis of predefined setpoint parameters does not exist, however. In the energy management devices offered on the market, in which, for example, those of ENNOVATIS have already reached a high level of innovation, loads and generators must be wired separately with the energy management system. Furthermore, localization information must be complexly programmed. In addition, only actual states may be detected and displayed.

Thus, for example, Application No. DE 10 2004 055088 A1 describes a system for detecting and storing measured data required for ascertaining and analyzing the consumption of a property, such as internal and external temperatures or the like, and for controlling the consumption of the property, using a data logger, and a data analyzer, having at least one input required for the measured data registration, having at least one control output, and having at least one interface for data readout. It is provided that all components are situated on a single, compact circuit board. A corresponding method provides that after initial programming of the system using a programming unit (PC), the system operates independently on the basis of its components.

A patent application (having no prior publication) of the applicant having the internal reference number R.328907 describes a method and a device for carrying out the method for an energy management system for optimizing loads and generation in an energy management network, which has at least one energy management unit, the actual state of the energy consumers or the energy generators being transmitted via combined energy supply/communication lines to the energy management unit and therefore independent configuration of the energy management unit being carried out, at least one setpoint parameter being set on the energy management unit.

If a plurality of different electricity rates, e.g., for household current, heat pump current, electric vehicle current, photovoltaic feed-in (PV supply), cogeneration feed-in, are used, the connection in the building is presently implemented using a plurality of feed-in and consumption meters. In research projects, so-called "smart meters" are being developed, which, in addition to registering the transmitted energy, also display switching information on the basis of energy prices to the consumers. However, these presume that the household is a customer of only one utility company. Application No. DE 20218473 U1, corresponding to Application No. EP 1 339 153 A3, describes such equipment for connecting a building or the like having at least one consumer and/or generator of electrical energy to a low-voltage system, which has at least one component in each case assigned to the consumer or generator in the form of a switch and/or a measuring element and an information processing unit, which allows bidirectional communication between an external grid control center and the consumer or generator and/or the component.

It is therefore an object of the present invention to provide a method which allows electricity services or electrical energy for different consumers and optionally different times of day to be purchased from various providers at independent rates, to deliver self-generated electrical energy from different generators and optionally at different times of day at independent rates and optionally to consume, cost-effectively, self-generated energy itself, preferably as far as it is meaningful.

Furthermore, it is an object of the present invention to provide a corresponding device for carrying out the method.

SUMMARY OF THE INVENTION

An object relating to the device is achieved in that the switching elements are situated in the form of a switching matrix, and therefore energy meters for generators and consumers or consumer groups are switchable in series or in parallel, as a function of a particular instantaneous feed-in or consumption rate, which is received by the energy management unit from different utility companies, an energy meter and one or more energy flow direction indicators for the accounting being assigned to each generator and each consumer or consumer group.

An object relating to the method is achieved in that, with the aid of a switching algorithm, the consumers or consumer groups are indexed beginning with an instantaneous highest purchase price and the generators are indexed beginning with a lowest feed-in remuneration and the generators and consumers or consumer groups are coupled with the aid of the switching elements in such a way that the number of the couplings of consumers or consumer groups having high purchase prices with generators having low feed-in remunerations is maximized, so that as many consumers or consumer groups as possible may be supplied directly by the generators.

Using the method and the device, in particular an efficient energy management system for residential and commercial buildings may be provided, in which an optimal utilization of cost-effectively generated energy for covering a consumption having high costs may be achieved, instantaneous feed-in and consumption rates of various utilities being able to be considered. This energy management system relates in particular to metering and accounting of energy consumptions and energy supplies. This is significant in particular with regard to future energy concepts for private, public, or also commercial buildings or facilities, in which in the future, in addition to solely purchasing energy from the grid, independent generators, for example, photovoltaic feed-in (PV supply) and cogeneration feed-in may be used efficiently. On the consumer side, for example, household appliances (washing machine, dishwasher, stove, etc.), heat pumps, electrical heaters, or in future increasingly also charging stations for electric vehicles or so-called PHEVs (plug-in hybrid electric vehicles) are to be mentioned. In addition, storage concepts, such as photovoltaic buffers, battery accumulators, or battery charging stations also come into consideration.

Generators, consumers, and accumulators will purchase or feed in their energy at different prices, as is already typical today, the price differences resulting on the generator side, for example, due to the encouragement to reduce $CO_2$ emissions, e.g., in the assessment system according to the EEG (Renewable Energy Act) or KWKG (Cogeneration Act), due to different bonus payments for feed-ins at specific times or centrally controllable feed-ins or due to other market incentives by the government or grid operators. On the consumer side, the differences result due to the possibility of a sales increase for utility companies (e.g., for heating current, heat pump current, or PHEV current), due to a bonus regulation for the consumption at specific times or a centrally controllable consumption (e.g., specific blocking times for the operation of heat pumps), and due to market incentives by the government or grid operators. For both sides, the purchase or the feed-in may result in rates which change over time for different providers, which may be taken into consideration using the concept according to the present invention.

In one preferred exemplary embodiment, three switching elements $m_A$, $m_B$, $m_C$ or $n_D$, $n_E$, $n_F$, one energy meter, and one or two energy flow direction indicators $Rm_C$, $Rm_A$ or $Rn_D$, $Rn_F$ are assigned for each consumer or for each consumer group and each generator, one of the energy flow direction indicators being able to be integrated into one of the energy meters. Therefore, similarly to a multi-switch array, a switch matrix may be implemented, using which the energy meters individually assigned to the generators and consumers may be switched in series for the private usage of the electricity and may be switched in parallel for the direct feed-in into the grid and the direct purchase of the electricity from the grid. In addition, the measurement of the electric current direction ensures that each consumer and each generator bills for energy using only the energy meter to which it is actually assigned.

An advantageous exemplary embodiment variant provides that the particular three switching elements $m_A$, $M_B$, $M_C$ or $n_D$, $n_E$, $n_F$, the energy meters, and the one or two energy flow direction indicators $Rm_C$, $Rm_A$, or $Rn_D$, $Rn_F$ are combined into modules for each consumer or for each consumer group and each generator, two different module types 1 and 2 being assigned to the consumers or the consumer groups and the generators. With regard to simple and also cost-effective installation, using this modular concept, different power distribution systems having a different number of consumers or consumer groups and generators may be implemented very easily. A later expansion of the installation with additional consumers or generators is therefore also possible.

With regard to simplified installation in the power distribution system, it is advantageous if module types 1 and 2 for the particular consumers or the particular consumer groups and for the particular generators may be linked together and have terminals for modules connected upstream and downstream.

Alternatively, module types 1 and 2 for the particular consumers or the particular consumer groups and for the particular generators may have terminals for shared coupling points 1 and 2 within the power distribution system, which also simplifies the installation in the power distribution system. A replacement of the modules is functionally corresponding in the above-mentioned cases; however, it must be taken into consideration that the directional arrows change when the modules are replaced.

In a particularly preferred exemplary embodiment variant, it is provided that the energy meters, the energy flow direction indicators, and the switching elements are designed as electronic components, and the analyzer and a switching algorithm for activating the switching elements are implemented as software in the energy management unit. The switching elements may be designed as semiconductor switches or as electromechanical power contactors. The different feed-in or consumer rates may be analyzed, buffered, and processed for activation of the switching elements within the energy management unit, which is designed as a central computer, the feed-in or consumption rates being able to be provided via appropriate information channels, as are described in the related art mentioned at the outset.

A preferred exemplary method variant provides that it is ascertained in queries whether, as a function of the instantaneous consumption prices and the feed-in remunerations of the individual consumers or consumer groups and the generators, and/or as a function of the energy flow direction, it is cost-effective to switch in further consumers or generators for coupling thereto or whether consumers or generators must be disconnected from the coupling due to metering at an excessively low rate.

Furthermore, in regard to optimum utilization of cost-effectively generated energy or in regard to avoidance of expensive energy upon purchase, it may be provided that in the event of changes in the particular feed-in remunerations for the generators and/or in the event of changes of the particular consumption prices for the consumers or consumer groups, renewed indexing is carried out for the consumers or consumer groups and the generators, and the couplings and their number are updated accordingly. A relevant price change exists if the sequence in a list of all feed-in and purchase prices changes, all prices being entered with positive signs in the list. The points in time of the queries may be predefined.

A relevant price change exists in particular if private consumption is no longer meaningful. It may therefore be provided that in the event of a rate change, upon which the lowest feed-in remuneration is greater than or equal to the highest consumption price, private consumption is suppressed and a direct feed-in of the energy generated by the generator or generators into a grid takes place.

In order to avoid an excessively large number of switching operations, it may be provided in an exemplary method variant that after a reduction of the number of the coupled generators and consumers, a renewed increase of the number is suppressed for a specific time. It may therefore also be ensured that consumption does not take place at an incorrect consumption rate, i.e., an excessively low rate, or feeding in does not take place at an incorrect feed-in rate, i.e., in this case an excessively high rate. If a consumer or a generator is operated uncoupled, although it is more cost-effective to couple it to the distribution system, private usage is avoided, but each consumer bills correctly. "Loss" for the user arises in that electricity is sold for little money and is purchased back for a large amount of money. However, nothing is billed via an incorrect meter. Therefore, this state is non-critical. However, if one generator or one consumer too many is coupled, it may occur that, for example, the household current consumers are supplied with heat pump current, which corresponds to a violation of a heat pump current contract. Therefore, this state is to be avoided.

In an exemplary method variant, it may be provided that the instantaneously ascertained feed-in or consumption price or prices, i.e., the remuneration or the price of the meter which is momentarily actively metering, are transmitted to controllable generators or consumers, which may then react accordingly. For example, the power consumption of the consumer or the generator power may be adapted, with the goal of avoiding the changeover of the coupling. This information may also be used for the purpose of warning consumers with high power consumption in advance that a consumption rate increase is instantaneously imminent, and the consumer reduces the power consumption accordingly or the consumer shuts down completely, which may be particularly cost-efficient during the operation of accumulators (e.g., electrical storage heating, charging stations, etc.), for example.

In order to avoid interruptions of the connection to the grid, during each switching operation, all closing actions must be executed first and then all opening actions. The time between closing and opening must be dimensioned in such a way that the switching elements which are too close are securely closed before other switching elements are opened. The load of the switching elements is thus also minimized, since they must never switch under load.

Exemplary embodiments of the present invention are explained in greater detail hereafter with reference to the accompanying drawings.

DETAILED DESCRIPTION

Figure 1:
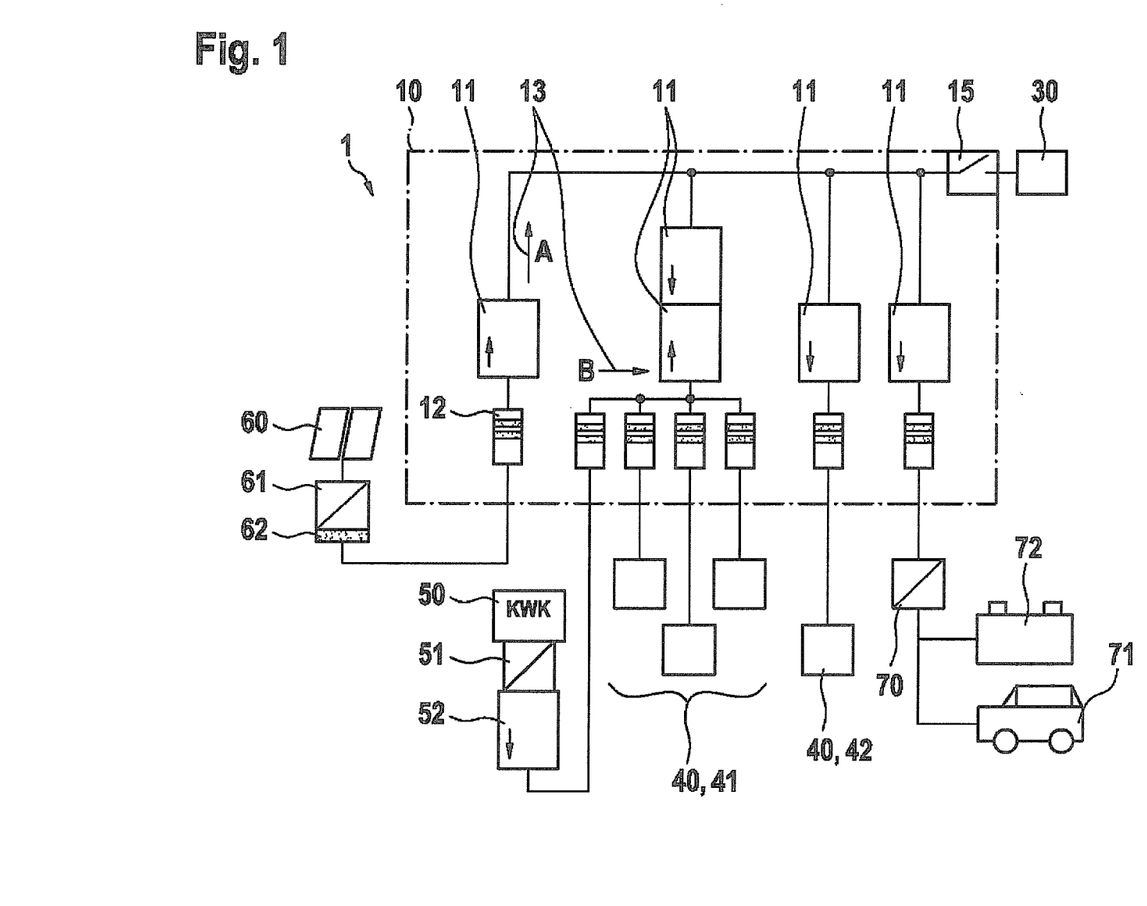
FIG. 1 shows a power distribution system for generators and consumers according to the related art.

FIG. 1 schematically shows a power distribution system 10 of an energy management network 1 according to the related art.

Power distribution system 10 is connected on the input side via a main switch 15 or main fuse to a grid 30 for low voltage (230 V alternating current or 400 V three-phase current). On the output side, various consumers 40 in the form of household consumers 41 or consumer groups (e.g., sockets, room lighting) are connected via an energy meter (single-phase alternating current meter or three-phase current meter) and via circuit breakers 12 (safety fuses or automatic circuit breakers) corresponding to the number of the consumers or circuits to grid 30. In addition, in the example shown, a heat pump 42 and a charging station 70 for an electric vehicle 71 or for a battery 72 for electric vehicle 71 are connected to the grid separately via two further energy meters 11 and circuit breakers 12 as consumers 40.

In addition, a photovoltaic facility 60 is schematically shown as a generator, which also feeds the generated electrical energy via inverter 61 and a cutoff point 62 into power distribution system 10, a separate energy meter 11 being provided for metering the energy and a current direction 13 in flow direction A toward grid 30 being provided. Furthermore, a cogeneration facility 50 is shown, which feeds the generated electrical energy via inverter 51 and a separate generation meter 52 into power distribution system 10. The feed-in occurs here in such a way that current direction 13 occurs in flow direction B and therefore a direct private consumption of this energy may be made possible. Circuit breakers 12 are also provided here for safety.

For the ascertainment of the linkage point of generators and consumers 40, it is necessary to know whether the remuneration for the fed-in current is higher or lower than the price for consumed current. In the example shown, the feed-in of the current of photovoltaic facility 60 directly into grid 30 is meaningful, since in this case a higher remuneration rate is paid (current flow A). In contrast, in the example of cogeneration facility 50, only a comparatively low feed-in rate is remunerated, so that a direct consumption by consumers 40, in particular household consumers 41, is cost-effective. If no electricity is instantaneously being consumed, this electricity may also be fed into grid 30 via another energy meter 11, which is connected in series with energy meter 11 for consumers 40, but only permits a metering direction opposite thereto.

The array shown in FIG. 1 is a rigid concept, which must be reconfigured in a complex way or reinstalled on the hardware side with regard to changing configurations in generators or consumers 40 or also in the event of rate adaptation.

Figure 2:
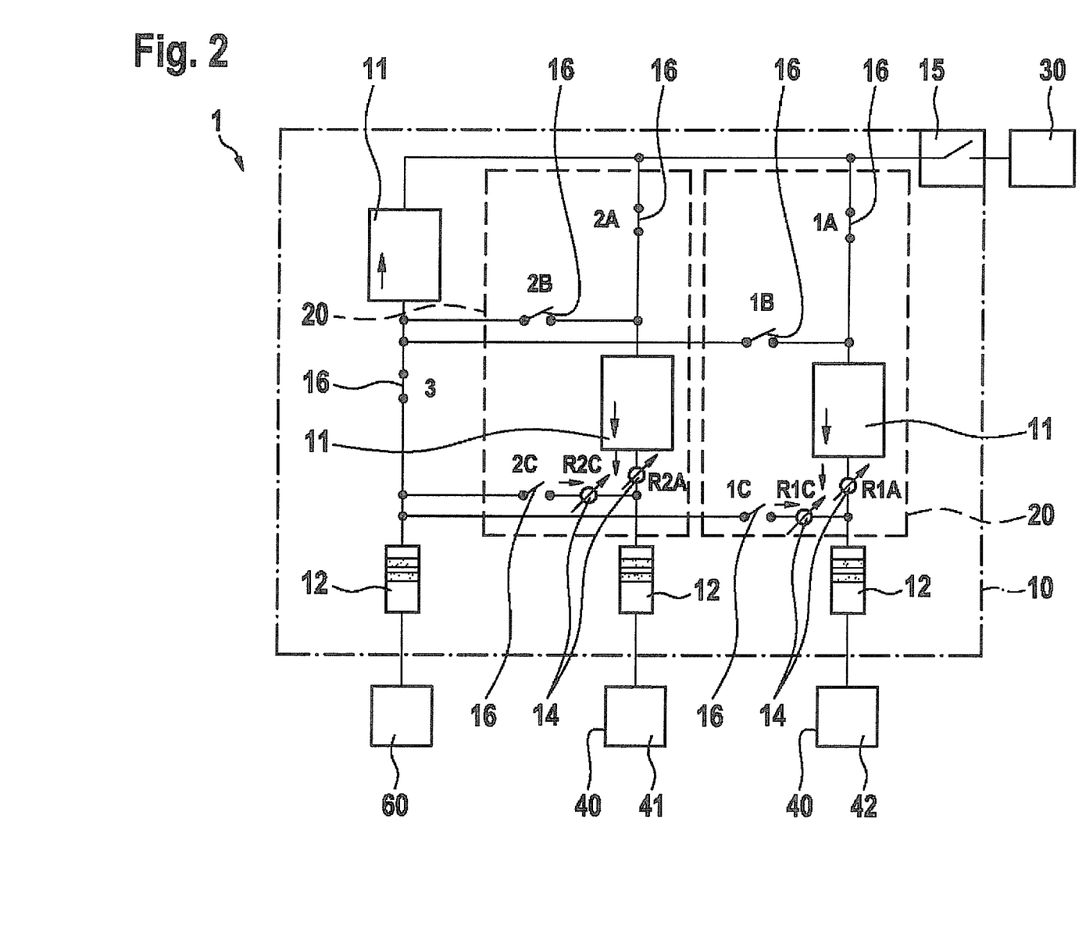
FIG. 2 shows a flexible power distribution system for one generator and two consumers in an exemplary embodiment according to the present invention.

An initially simplified model for a power distribution system 10 according to an exemplary embodiment of the present invention of an energy management network 1 is shown in FIG. 2.

In the example shown, only one generation facility in the form of a photovoltaic facility 60 and two consumers 40 in the form of household consumers 41 and a heat pump 42 are shown. Power distribution system 10 is connected via a main switch 15 in the form of a main fuse to grid 30 for low voltage. The facility essentially includes electronic current meters 11 having a specific metering direction, which have a backstop, circuit breakers 12 in the form of automatic circuit breakers for the various generator or consumer circuits, diverse mechanical switching elements or switching elements 16 designed as semiconductor contactors, whose switch position may be influenced by an energy management unit (not shown in this view), and energy flow direction indicators 14.

Two similarly configured modules 20 are provided for the two consumers 40, which each have three switching elements 16 $1_A$, $1_B$, $1_C$ or $2_A$, $2_B$, $2_C$, an energy meter 11, and two energy flow direction indicators 14 $R1_C$, $R1_A$, or $R2_C$, $R2_A$. It may be provided that in each case one of energy flow direction indicators 14 ($R1_A$ or $R2_A$) may be integrated into particular energy meter 11, since an electronic meter may automatically also determine the flow direction. For the generator, in this simplified example, initially only one switch element 16 (number 3) and one energy meter 11 are provided.

Figure 3:
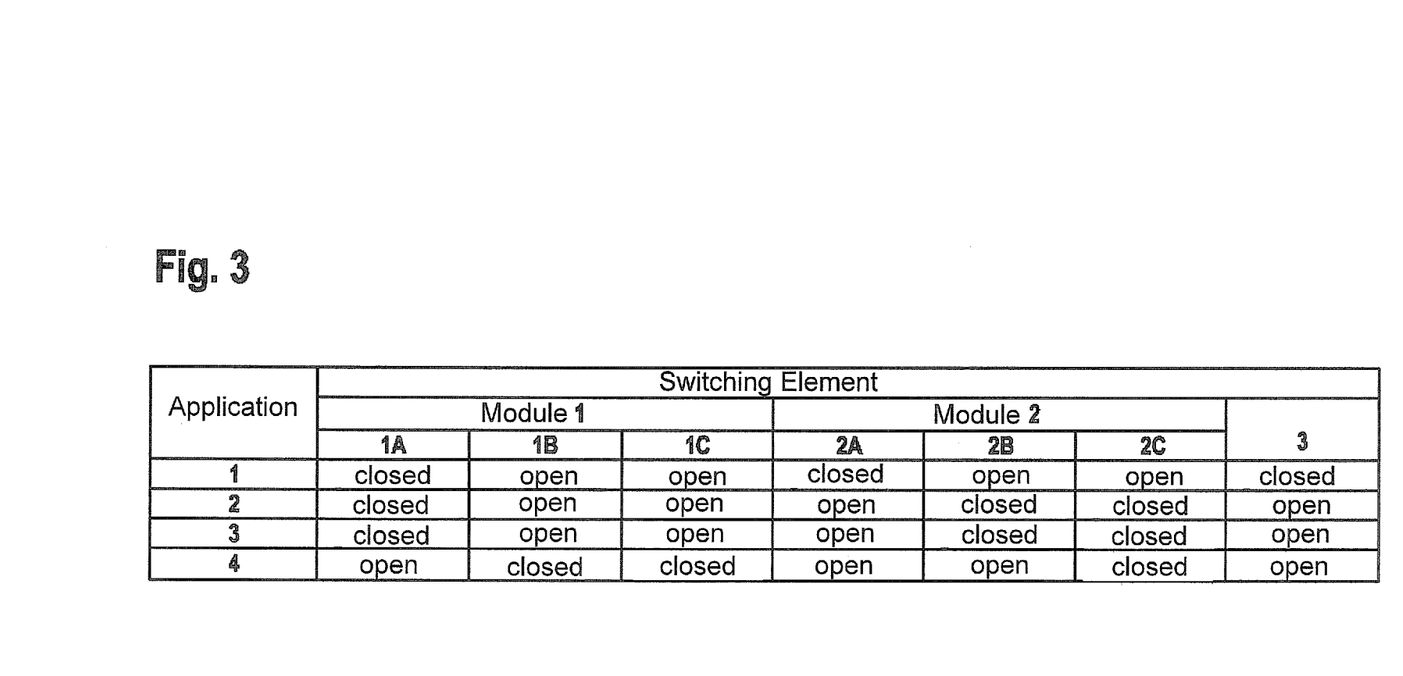
FIG. 3 shows a value table for various applications for the exemplary array shown in FIG. 2.

The applications described hereafter list which state switching elements 16 have when different feed-in and consumption rates are taken as the basis for photovoltaic facility 60 and household consumers 41 and heat pump 42. FIG. 3 shows the switching states of the various switching elements in a corresponding table.

Case 1:

In the case shown in FIG. 2, the feed-in remuneration for photovoltaic facility 60 is higher than the consumption rates for household consumers 41 and heat pump 42, so that the entire PV current is sold to grid 30 and the electricity is purchased from grid 30. Switching elements 16 $1_A$, $2_A$, and 3 are closed. This also corresponds to the situation shown in FIG. 1.

Case 2:

If the feed-in remuneration for photovoltaic facility 60 drops below the price of the household current due to a rate which changes over time, it is cost-effectively meaningful to cover the household current for household consumers 41 using electricity from photovoltaic facility 60. For this purpose, energy meters 11 for photovoltaic facility 60 and for household consumers 41 must be connected in series, so that excess electricity from photovoltaic facility 60 and additionally required household current are correctly entered depending on the ratio of the powers. Therefore, in this case, in contrast to case 1, switching elements 16 $2_3$ and $2_C$ are closed and $2_A$ and 3 are opened.

Case 3:

If the feed-in remuneration for photovoltaic facility 60 drops further, so that it also falls below the consumption rate for heat pump 42, it would be meaningful for photovoltaic facility 60 to also supply heat pump 42 with electricity in addition to household consumers 41; however, household consumers 41 should be supplied with photovoltaic electricity with priority. Therefore, in this case the switching states are maintained as for case 2 (cf. FIG. 3). In this case, it is solely provided that the direction measurement is monitored using energy flow direction indicator 14 $R2_A$. As long as electricity is purchased, the consumption of household consumers 41 is higher than the generation of photovoltaic facility 60, so that heat pump 42 must be supplied from grid 30. This is recognized in that the direction measurement using energy flow direction indicator 14 $R2_A$ establishes a power flow in the direction of household consumers 41.

Case 4:

In this case, the generator power of photovoltaic facility 60 is greater than the consumption of household consumers 41.

Both consumers are connected in parallel here by closing switching elements 16 $1_C$ and $2_C$. By closing switching element 16 $1_B$, it is ensured that additional electricity purchased from grid 30 is metered as heat pump current. Excess PV current, which exceeds the consumption of household consumers 41 and heat pump 42, is still registered via energy meter 11 for photovoltaic facility 60.

In the event of dropping generating power or rising consumption of household consumers 41, it must be monitored in this case that no electricity which would be metered as heat pump current by energy meter 11 for heat pump 42 is used to supply household consumers 41 via switching elements 16 $1_C$ and $2_C$. This is recognized by a flow direction reversal in energy flow direction indicator 14 $R1_C$. It is necessary to switch back to above-mentioned case 3 if electricity for heat pump 42 flows away from energy meter 11.

Similarly to cases 2, 3, and 4, cases may also be constructed for a heat pump rate which is higher than the household rate. For this purpose, in each case switching elements 16 $1_A$, $1_B$, $1_C$ are to be replaced by switching elements 16 $2_A$, $2_B$, $2_C$ and energy flow direction indicators 14 are to be replaced accordingly. This case may occur in the daytime, for example, if operation of heat pumps 42 is not desired by the grid operator.

Figure 4:
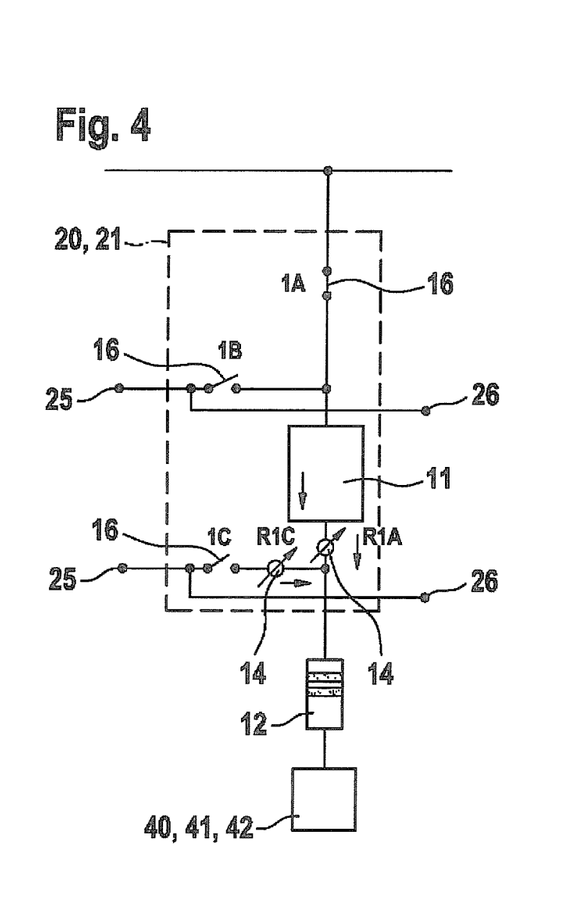
FIG. 4 shows a schematic configuration of an exemplary module according to a module type 1 for consumers.

FIG. 4 shows an exemplary module 20, which is designed as a module type 1 21 for consumers 40 (household consumers 41, heat pumps 42, etc.), which are connected via a circuit breaker 12 (automatic circuit breaker) to module 20. Module 20 is connected at the input side to a distribution line for grid 30 (not shown here). In addition to switch elements 16, energy meter 11, and energy flow direction indicators 14, which were already shown in FIG. 2, module 20 shown here of module type 1 21 has terminals 25, 26 for modules 20 of the same type connected upstream and downstream, so that they may be linked together. Terminals 25 and 26 may be implemented as single-phase or three-phase.

Figure 5:
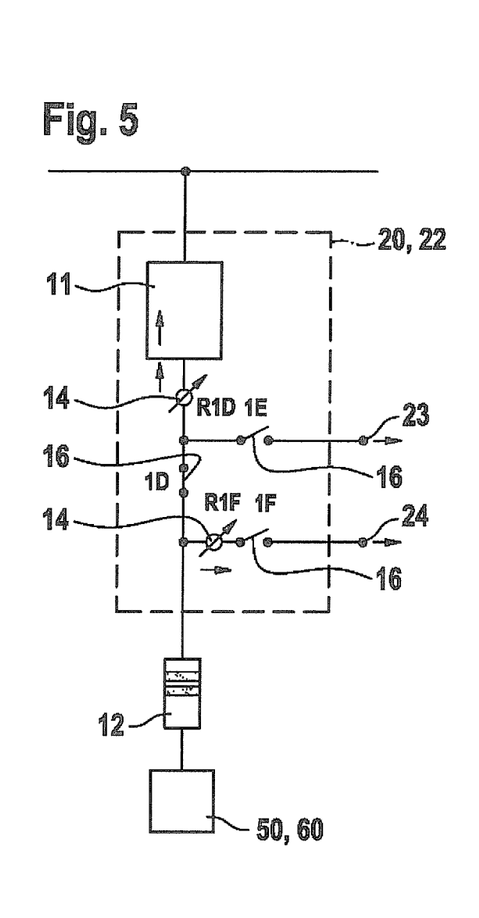
FIG. 5 shows a schematic configuration of an exemplary module according to a module type 2 for generators.

FIG. 5 shows a universally usable exemplary module 20, which is designed as a module type 2 22 for generators 50, 60, which are connected via a circuit breaker 12 (automatic circuit breaker) to module 20. On the input side, module 20 is connected to a distribution line for grid 30 (not shown here). Three switching elements 16 $1_D$, $1_E$, $1_F$ and an energy meter 11 and two energy flow direction indicators 14 $R1_D$, $R1_F$ are integrated into this module 20. Additional switching elements 16 $1_E$, $1_F$, which are shown in addition in relation to switching element 16 3 shown in FIG. 2 (corresponding to switching element 16 $1_D$ in FIG. 5), may be used if multiple modules 20 of this type are interconnected in parallel, and the individual generators may be interconnected independently of one another for private supply or grid feed-in. Module type 2 22 has, in this context in the form shown here, terminals 23, 24 for shared coupling points (e.g., in the form of a single-phase or three-phase busbar) within power distribution system 10 from FIG. 1.

Figure 6:
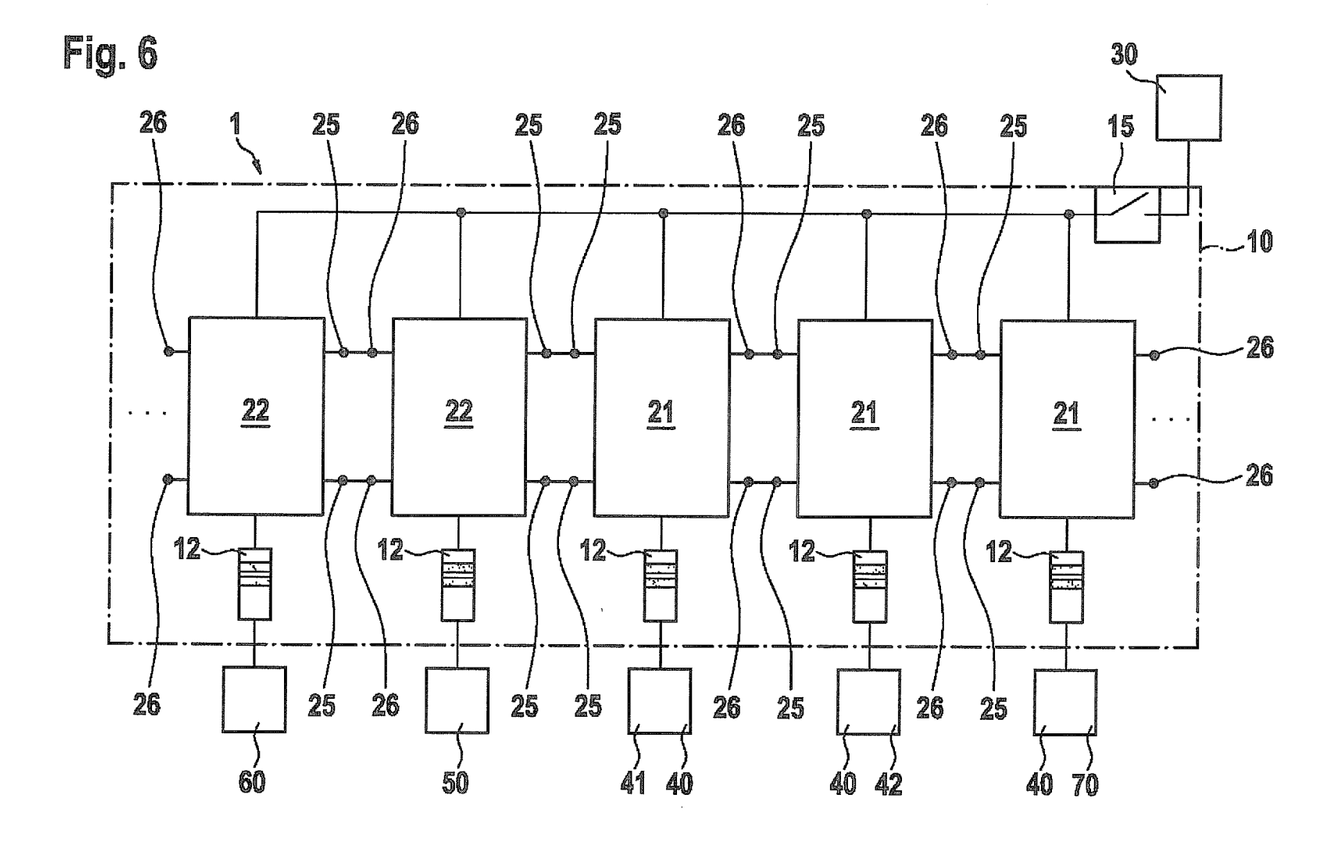
FIG. 6 shows a schematic view of an exemplary power distribution system in a modular configuration.

FIG. 6 shows an exemplary power distribution system 10 of an energy management network 1 having two generators 50, 60 and three consumers 40. In addition to power distribution system 10 shown in FIG. 2, for example, a charging station for an electric vehicle 70 is added as an additional consumer 40 and a cogeneration facility 50 is added as an additional generator. The modules of module type 1 21 for various consumers 40, 41, 42, 70 and the modules of module type 2 22 for various generators 50, 60 are, as shown in FIGS. 4 and 5 on the examples of module type 1 21 and module type 2 22, equipped with terminals 25 and 26 for modules connected upstream and downstream. In the particular outermost modules, terminals 26 remain open for later expansion. All modules 21, 22 are connected via a busbar and a main switch 15 to grid 30. Generators and consumers 40 are connected via circuit breakers 12 to modules 21, 22. Modules for feeders (module type 2 22) and consumers (module type 1 21) may also be installed mixed.

It is to be noted here that private consumption also exists if the feed-in occurs in one phase and the consumption occurs in another phase in a multiphase grid. Therefore, in the case of use on a three-phase building connection, as is typical in Germany, for example, all are to be designed in three-phase form. Accordingly, only a single-phase design is necessary in the case of a single-phase building connection.

Energy meters 11, energy flow direction indicators 14, and switching elements 16 within modules 20, 21, 22 are preferably designed as electronic components. The analyzer and a switching algorithm for activating switching elements 16 are implemented as software in the energy management unit.

In another exemplary embodiment, the accounting may be performed completely with the aid of software. The individual outgoing circuits to consumers 40, 41, 42, 70 and generators 50, 60 each have separate physical energy meters 11, which transfer the particular instantaneous power to a central computer. Switching devices and power direction indicators and the metering mechanisms for billing are implemented as software.

Figure 7:
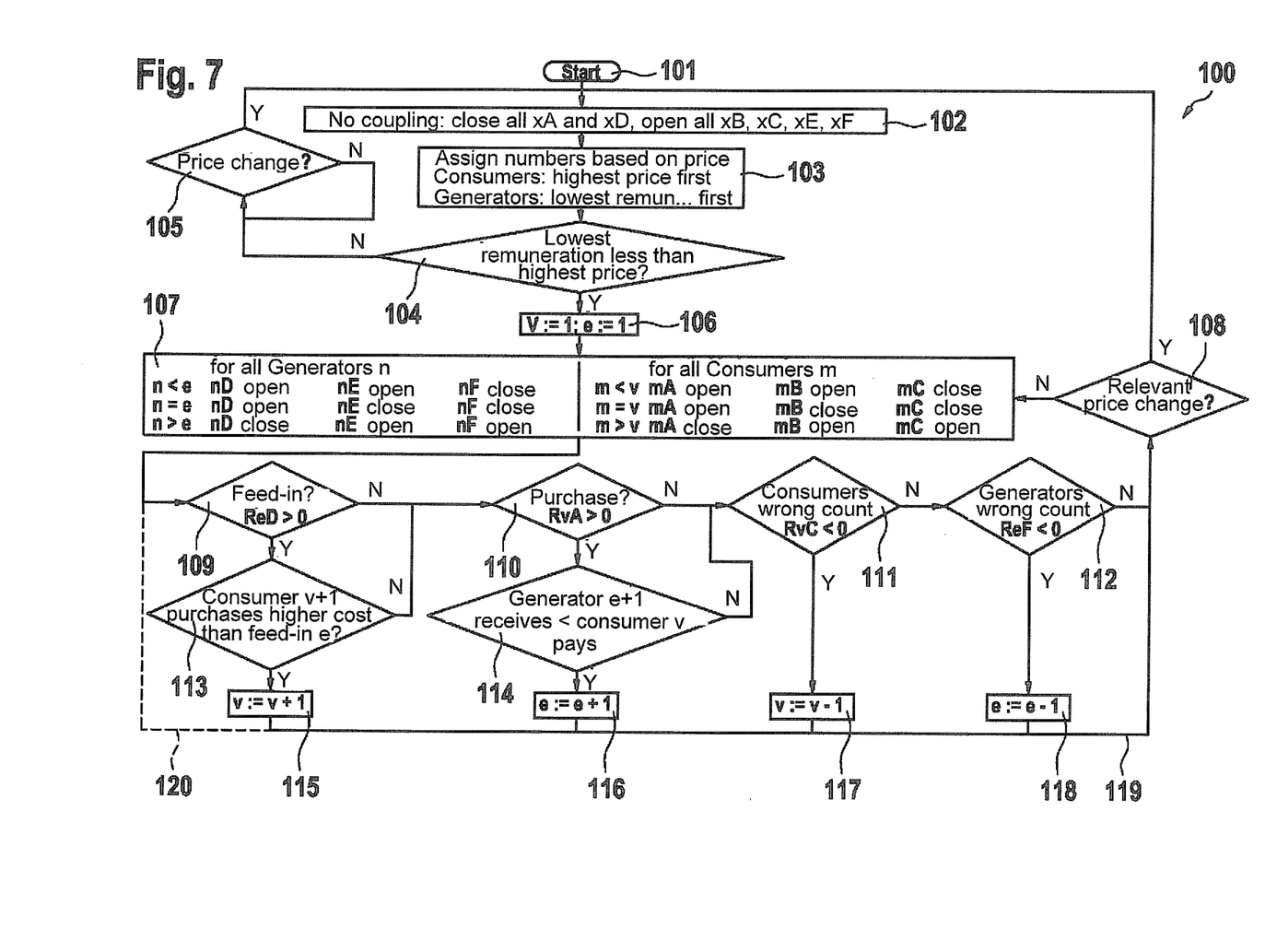
FIG. 7 shows a flow chart for an exemplary method algorithm.

An exemplary switching algorithm to be used for this purpose is shown by way of example in FIG. 7 as a flow chart 100.

At start 101, in function block I 102, all consumers and generators are initially decoupled, all switching elements 16 $m_A$ and $n_D$ being closed and switching elements 16 $m_B$, $m_C$ or $n_E$, $n_F$ being opened, m standing for the mth module of module type 1 21 for consumers 40 and n standing for the nth module of module type 2 22 for generators. Sorting takes place in function block II 103, consumers 40 or consumer groups being indexed beginning with an instantaneous highest purchase price and the generators being indexed beginning with a lowest feed-in remuneration. In a query I 104, it is ascertained whether the lowest remuneration is less than the highest purchase price. If this is not the case, it is ascertained in a query II 105 whether a price change exists. If this is the case, the sequence branches to function block I 102, to perform renewed indexing.

If, as a result of query I 104, the lowest remuneration is greater than or equal to the highest purchase price, variables v and e are each set equal to 1 in function block III 106 and switching elements 16 of modules 20 are set appropriately according to following function block IV 107 (see content of function block IV 107, FIG. 7), v specifying the number of the consumers or consumer groups and e specifying the number of the generators which are interconnected with the coupling point. The remaining generators and consumers or consumer groups are operated separately on the grid.

In following queries IV, V, VI, VII, VIII, IX 109, 110, 111, 112, 113, 114, it is ascertained whether, as a function of the instantaneous consumption prices and the feed-in remunerations of individual consumers 40 or consumer groups and the generators, it is cost-effective to switch in further consumers or generators to the coupling (increase of v or e) or to disconnect them from the coupling (reduction of v or e), the switching in of consumers taking place in meter I 115, and the switching in of generators taking place in meter II 116.

An alternative to the return upon each relevant price change are the following queries (parallel to query VIII 113 and to meter I 115 or parallel to query IX 114 and to meter II 116):

Consumer rate lower than feed-in? If yes, v is reduced in meter III 117.

Consumer rate higher than feed-in? If yes, e is reduced in meter IV 118.

Overall, using this algorithm and with the aid of switching elements 16, the generators and consumers 40 or consumer groups are coupled in such a way that as many consumers 40 or consumer groups as possible having high purchase prices are connected to generators having low feed-in remunerations.

This sequence of the switching algorithm is terminated via a path A 119 having query III 108, in which it is checked whether a relevant price change exists in the meantime. If this is the case, the sequence branches to function block I 102 to carry out renewed indexing. If this is not the case, the sequence branches to function block IV 107. Therefore, in the event of changes in the particular feed-in remuneration for the generators and/or in the event of changes of the particular consumption prices for consumers 40 or consumer groups, renewed indexing is carried out for consumers 40 or consumer groups and the generators and the couplings and their numbers are updated accordingly.

Furthermore, it is provided that in the event of a rate change, upon which the lowest feed-in remuneration is greater than or equal to the highest consumption price, private consumption is suppressed and the energy generated by the generator or generators is directly fed into a grid 30 (cf. query I 104).

After the last steps, multiple algorithm alternatives are possible, which have no influence on the results. Thus, for example, it may be provided that in an exemplary method variant, the switching algorithm is terminated via a path B 120.

Using the presented method and the corresponding device for carrying out this exemplary method, optimum utilization of cost-effectively generated energy for covering a consumption at high costs may be achieved, instantaneous feed-in rates and consumption rates of various utility companies being able to be taken into consideration, which will assist future intelligent energy management systems for low-voltage systems in buildings or the like.

What is claimed is:

1. A device for an energy management system in a form of at least one energy management unit for optimizing loads and generation in an energy management network, the device configured for connection in a power distribution system having a plurality of separate electrical consumers and a plurality of separate power generators, the device comprising:

switching elements and energy meters, which are influenceable or analyzable by the energy management unit via a connection thereto, wherein the switching elements are situated in a switching matrix including a plurality of switching modules such that the energy meters for the generators and the consumers are switchable in series or in parallel, as a function of a particular instantaneous feed-in remuneration pricing rate of a generator or consumption pricing rate of a consumer, which are received by the energy management unit from different utility companies, wherein each of the plurality of switching modules includes a plurality of structural elements and is integrated into the switching matrix, wherein the structural elements include a plurality of switches, an energy meter and at least one energy flow direction indicator, a separate switching module being assigned to each generator and each consumer for billing, wherein, when a lowest feed-in remuneration pricing rate is greater than or equal to a highest consumption pricing rate, the switching elements decouple the generators from the consumers, couple the generators to a public power grid, and couple the consumers to the public power grid.

2. The device according to claim 1, wherein each of the plurality of switching modules includes three switching elements, one energy meter, and one or two energy flow direction indicators, and one of the energy flow direction indicators is able to be integrated into the energy meter.

3. The device according to claim 2, wherein a first module type having a first structure is assigned to the consumers and a second, different module type having a second structure different than the first structure is assigned to the generators.

4. The device according to claim 3, wherein the first module type and the second module type may be linked together via terminals for modules connected upstream and downstream.

5. The device according to claim 3, wherein the first module type and the second module type have terminals for shared coupling points within the power distribution system.

6. The device according to claim 1, wherein the energy meters, the energy flow direction indicators, and the switching elements are designed as electronic components, and an analyzer and a switching algorithm for activating the switching elements are implemented as software in the energy management unit.

7. The device according to claim 1, wherein at least one of the separate consumers is a consumer group.

8. The device according to claim 1, wherein the energy meters for the generators and the consumers are connected in series during a use of power from a private generator and in parallel during a use of power from a direct feed-in to the public power grid.

9. A method for registering electrical consumption and generation in an energy management network, which has at least one energy management unit, and, in a power distribution system, at least one electrical consumer and at least one generator being interconnected via switching elements and energy meters, which are influenced or analyzed by the energy management unit, the method comprising:

indexing, via a switching algorithm, the consumers, beginning with an instantaneous highest purchase price, and the generators, beginning with a lowest feed-in remuneration, and coupling, based on the indexing, the consumers and the generators via the switching elements such that a number of couplings of the consumers having high purchase prices with the generators having low feed-in remunerations is maximized.

wherein, when the lowest feed-in remuneration is greater than or equal to the highest purchase price, the switching elements decouple the generators from the consumers, couple the generators to a public power grid, and couple the consumers to the public power grid.

10. The method according to claim 9, further comprising:

ascertaining via queries whether further consumers or generators are switched into the coupling or disconnected from the coupling, at least one of (i) as a function of the instantaneous purchase prices and the feed-in remunerations of the consumers and the generators, respectively, and (ii) as a function of energy flow direction.

11. The method according to claim 9, further comprising:

carrying out renewed indexing for the consumers, the generators and the couplings, and updating the number of couplings accordingly, in an event of changes in at least one of (i) the feed-in remunerations for the generators and (ii) the instantaneous purchase prices for the consumers.

12. The method according to claim 11, further comprising:

suppressing private consumption and feeding energy generated by the generators directly into a grid, in an event of a rate change, upon which the lowest feed-in remuneration is greater than or equal to the highest purchase price.

13. The method according to claim 9, further comprising:

suppressing a renewed increase of the number of couplings for a predetermined time after a reduction of the number of couplings of the generators and the consumers.

14. The method according to claim 9, further comprising:

transmitting the instantaneously ascertained feed-in remuneration or purchase price to controllable generators and consumers.

15. The method according to claim 9, further comprising:

during each switching operation, executing all closing actions first and then all opening actions.

16. The method according to claim 9, wherein the switching elements are included in a plurality of switching modules that each include a plurality of structural elements, wherein the structural elements include a plurality of switches, an energy meter and at least one energy flow direction indicator, and wherein a separate switching module is assigned to each generator and each consumer.

17. The method according to claim 9, wherein the energy meters for the generators and the consumers are connected in series during a use of power from a private generator and in parallel during a use of power from a direct feed-in to the public power grid.

* * * * *